(12) United States Patent
Bruening et al.

(10) Patent No.: US 10,390,465 B2
(45) Date of Patent: Aug. 20, 2019

(54) KNEE RETAINER WITH A HEAT-CONDUCTING DEVICE

(71) Applicant: Dr. Ing. h.c. F. Porsche Aktiengesellschaft, Stuttgart (DE)

(72) Inventors: Thomas Bruening, Eberdingen (DE); Oliver Mayer, Karlsruhe (DE); Christoph Stockert, Pforzheim (DE); Bernt Wallrabe, Simmozheim (DE)

(73) Assignee: DR. ING. H.C. F. PORSCHE AKTIENGESELLSCHAFT, Stuttgart (DE)

( * ) Notice: Subject to any disclaimer, the term of this patent is extended or adjusted under 35 U.S.C. 154(b) by 586 days.

(21) Appl. No.: 15/200,032

(22) Filed: Jul. 1, 2016

(65) Prior Publication Data

US 2017/0034956 A1 Feb. 2, 2017

(30) Foreign Application Priority Data

Jul. 27, 2015 (DE) .......................... 10 2015 112 186

(51) Int. Cl.
*B60H 1/00* (2006.01)
*B60R 21/04* (2006.01)
*H05K 7/20* (2006.01)

(52) U.S. Cl.
CPC ..... *H05K 7/20854* (2013.01); *B60H 1/00285* (2013.01); *B60H 1/00735* (2013.01); *B60H 1/00792* (2013.01); *B60R 21/04* (2013.01)

(58) Field of Classification Search
CPC ................... B60R 2021/0051; B60H 1/00792
See application file for complete search history.

(56) References Cited

U.S. PATENT DOCUMENTS

| | | | | |
|---|---|---|---|---|
| 5,862,674 A | * | 1/1999 | Ichishi et al. | B60H 1/00792 62/186 |
| 5,951,045 A | | 9/1999 | Almefelt et al. | |
| 6,176,544 B1 | * | 1/2001 | Seksaria et al. | B60R 21/045 280/752 |
| 2002/0003692 A1 | | 1/2002 | Sprattle et al. | |
| 2003/0057760 A1 | | 3/2003 | Horsch | |
| 2005/0029794 A1 | * | 2/2005 | Riefe et al. | B60R 21/09 280/777 |
| 2007/0115636 A1 | | 5/2007 | Appel et al. | |
| 2008/0048425 A1 | * | 2/2008 | Hayata | B60R 21/045 280/751 |
| 2009/0020993 A1 | * | 1/2009 | Cappabianca et al. | B60R 21/045 280/752 |

(Continued)

FOREIGN PATENT DOCUMENTS

| | | |
|---|---|---|
| CN | 1980821 A | 6/2007 |
| CN | 201347043 Y | 11/2009 |

(Continued)

*Primary Examiner* — Allen J Flanigan
(74) *Attorney, Agent, or Firm* — Leydig, Voit & Mayer, Ltd.

(57) ABSTRACT

A knee retainer for a vehicle includes at least one dissipating device configured to dissipate air, which has been tempered by an electronic element of the vehicle and is conducted on to the knee retainer. The at least one dissipating device is configured to dissipate the tempered air in such a manner that the tempered air is conducted past a region of the vehicle to be protected against temperature effects caused by the tempered air.

11 Claims, 3 Drawing Sheets

(56) References Cited

U.S. PATENT DOCUMENTS

| | | | |
|---|---|---|---|
| 2010/0014556 A1* | 1/2010 | Huynh | B60H 1/00792 |
| | | | 374/147 |
| 2011/0094725 A1 | 4/2011 | Oman et al. | |
| 2011/0181066 A1 | 7/2011 | Pandura et al. | |
| 2012/0181003 A1* | 7/2012 | Zurowski et al. | |
| | | | H05K 7/20154 |
| | | | 165/121 |

FOREIGN PATENT DOCUMENTS

| | | | | |
|---|---|---|---|---|
| CN | 204733506 U | 10/2015 | | |
| DE | 3916899 C2 | 11/1990 | | |
| DE | 4436547 A1 | 4/1996 | | |
| DE | 10146495 A1 | 4/2003 | | |
| DE | 102005056046 A1 | 6/2007 | | |
| JP | 04050022 A * | 2/1992 | | B60H 1/00792 |
| JP | 2010195304 A | 9/2010 | | |
| WO | WO 2013183388 A1 | 12/2013 | | |
| WO | WO 2015033642 A1 | 3/2015 | | |

\* cited by examiner

KNEE RETAINER WITH A HEAT-CONDUCTING DEVICE

CROSS-REFERENCE TO PRIOR APPLICATION

Priority is claimed to German Patent Application No. DE 10 2015 112 186.7, filed on Jul. 27, 2015, the entire disclosure of which is hereby incorporated by reference herein.

FIELD

The present invention relates to a knee retainer in a vehicle, with at least one dissipating device for dissipating tempered air. Furthermore, the present invention relates to an entertainment system for a vehicle and to a vehicle with a knee retainer and with an entertainment system.

BACKGROUND

On account of continuously increasing demands imposed on the accident safety of a vehicle, use is increasingly made of devices for guiding limbs of passengers, such as, for example, knee retainers, which are intended to prevent the passengers becoming wedged in the vehicle or the passengers being injured by deforming parts in the event of an accident. Since knee retainers of this type are preferably to be arranged in a construction space in which electronic elements of the vehicle are traditionally arranged, a knee retainer may cause thermally unfavorable flows which lead to malfunctions of electronic elements or of sensors of the vehicle.

German document DE 39 16 899 C2 discloses a housing for accommodating an electric circuit. A heat removal element for removing heat can be integrated here in a floor of the housing.

German document DE 44 36 547 A1 discloses a housing for electronic assemblies with a heat-insulating partition.

US document US 2002/0003692 A1 discloses a connection, which is realized via a heat-conducting body, of an electromagnetic shield to an electronic assembly.

The document US 2011/0094725 A1 discloses a heat guard for an electronic system, said heat guard preventing a predefined maximum operating temperature from being exceeded.

SUMMARY

In an embodiment, the present invention provides a knee retainer for a vehicle. At least one dissipating device is configured to dissipate air, which has been tempered by an electronic element of the vehicle and is conducted on to the knee retainer. The at least one dissipating device is configured to dissipate the tempered air in such a manner that the tempered air is conducted past a region of the vehicle to be protected against temperature effects caused by the tempered air.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
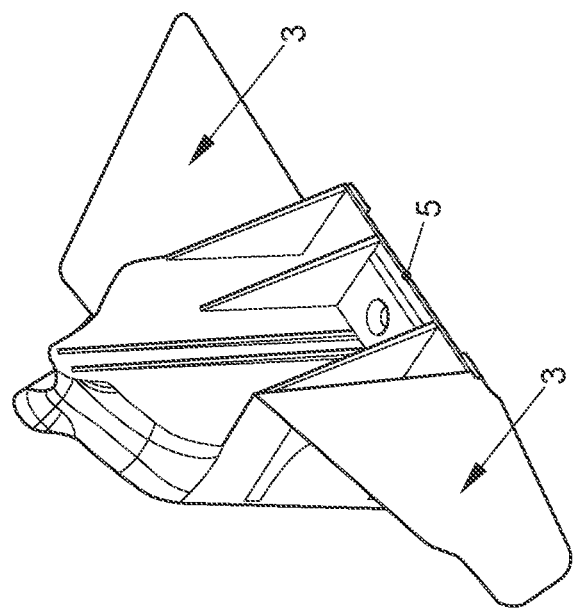
FIG. 1 shows an embodiment of the knee retainer according to the present invention.
Figure 1:
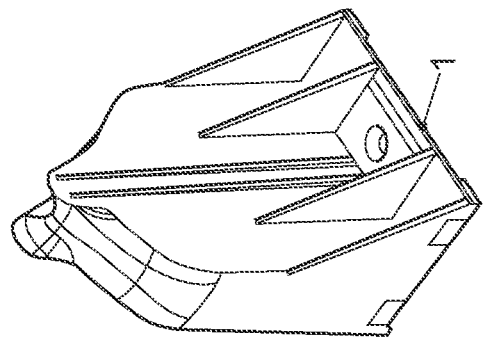

In an embodiment, the present invention provides a knee retainer for a vehicle, which knee retainer permits stable operation of all of the electronic elements interacting with the knee retainer.

A knee retainer for a vehicle is presented, wherein the knee retainer comprises at least one dissipating device for dissipating tempered air, and wherein the at least one dissipating device is configured to dissipate air, which is tempered by an electronic element of the vehicle and is to be conducted on to the knee retainer, in such a manner that the tempered air can be conducted past a region of the vehicle, which region is to be protected against temperature effects caused by the tempered air.

The presented knee retainer serves in particular for dissipating air, which is heated by an entertainment system, around a temperature sensor of an air conditioning system of a respective vehicle or past the temperature sensor such that a measuring result of the temperature sensor is not adversely affected by the heated air, and the temperature sensor correctly detects a current interior temperature of the vehicle independently of the air heated by the entertainment system and is optionally provided for further use of further elements of the vehicle, such as, for example, an air conditioning system.

Of course, the presented knee retainer can also be used for dissipating heated air from any further heat source, in particular any further electronic element of a vehicle.

Within the context of the present invention, a knee retainer should be understood as meaning a mechanical guide element which is preferably arranged in a region of a vehicle, into which region a knee of a passenger of the vehicle, in particular the knee of the driver of the vehicle, penetrates in the event of an accident, such as, for example, a frontal impact, and which guide element guides the knee of the passenger along a predetermined trajectory away from a vehicle region being deformed in the accident.

Knee retainers are preferably shovel-shaped guide elements with a receptacle and a guide path along which the knee of the passenger is guided.

By means of the combination, which is provided according to an embodiment of the invention, of at least one dissipating device, such as, for example, a heat-conducting plate, with a basic body of a knee retainer, the air approaching the knee retainer according to the invention can be removed along a predetermined flow path without negative influences occurring, for example admission of heat into a measurement region of a temperature sensor of a respective vehicle. For this purpose, it is provided that the at least one dissipating device detects an air flow approaching the knee retainer and diverts said air flow, i.e. guides same along a changed predetermined trajectory. In a corresponding manner, the at least one dissipating device comprises a receptacle and a guide path, along which the air flow approaching the knee retainer or the air approaching the knee retainer is guided.

In an embodiment of the presented knee retainer, it is provided that the knee retainer can be arranged on the vehicle in such a manner that the tempered air can be conducted past the region to be protected in such a manner that an interior temperature of the vehicle can be correctly detected independently of the tempered air by at least one temperature sensor arranged in the region.

It is conceivable for the at least one dissipating device to be configured as a flat and/or as a spatial, i.e. three-dimensional, structure, such as, for example, as a tunnel, through which an air flow, which approaches the knee retainer, of air tempered by an electronic device is removed into, for example, the surroundings of the vehicle or into a region outside a measurement region of the respective temperature sensor.

In particular, it is provided that the at least one dissipating device has bent portions which guide an incoming air flow in a predetermined direction or along a predetermined trajectory.

In a further embodiment of the presented knee retainer, it is provided that the knee retainer is formed from a material from the following list of materials or from a combination thereof: metal, plastic and composite material.

The presented knee retainer can be manufactured, in particular in the basic body thereof, from any technically suitable material for absorbing energy occurring in the event of an impact by means of a knee or a leg, wherein it is conceivable for the at least one dissipating device to be manufactured from the same material, such as the structure provided for accommodating the knee or leg, i.e. such as of the basic body of the presented knee retainer. Of course, the at least one dissipating device provided according to the invention can also be composed of any further technically suitable material for dissipating air flows.

Within the context of the present invention, a basic body should be understood as meaning that part of a knee retainer on which the at least one dissipating device is arranged and which is provided for accommodating a knee in the event of an accident.

In a further embodiment of the presented knee retainer, it is provided that the at least one dissipating device is arranged horizontally and/or vertically with respect to a basic body of the knee retainer and is arranged laterally and/or centrally on the basic body.

In general, it is conceivable for the at least one dissipating device provided according to the invention to be arranged at any desired point of the basic body of the presented knee retainer, wherein the at least one dissipating device can also repeatedly intersect or touch the basic body of the presented knee retainer and/or can intersect or touch further dissipating devices arranged on the basic body of the knee retainer.

In particular, it is provided that, on the basic body of the presented knee retainer, a dissipating device which is flat and is oriented horizontally in the longitudinal direction, i.e. in the direction of a lower side of the basic body, is arranged on a first side and a further flat dissipating device is arranged on a second side which is oriented vertically in the longitudinal direction in the lateral direction of the basic body.

In another embodiment, the present invention provides an entertainment system for a vehicle, wherein the entertainment system is configured to conduct air tempered by the entertainment system to at least one dissipating device arranged on a knee retainer and to conduct said air past a region of the vehicle, which region is to be protected against temperature effects caused by the tempered air.

The presented entertainment system can comprise, for example, a radio and/or navigation system with corresponding electronics, such as, for example, with a number of display units.

The presented knee retainer serves in particular for protecting a region of a vehicle, such as, for example, a measurement region of a temperature sensor, against heat which is produced during the operation of the presented entertainment system and is distributed in the vehicle by an air flow. Accordingly, it is provided that the presented entertainment system is configured in such a manner that waste heat produced by the presented entertainment system is blown on to the at least one dissipating device provided according to the invention. For this purpose, the entertainment system can have, for example, openings at predetermined points, which openings are arranged or are oriented in relation to or relative to the at least one dissipating device provided according to an embodiment of the invention.

In another embodiment, the present invention provides a vehicle with a refinement of the presented knee retainer and a refinement of the presented entertainment system, wherein the knee retainer and/or the entertainment system, i.e., for example, part of the entertainment system, such as, for example, a heat-producing control device, are/is arranged in a region within a knee impact region of the vehicle.

The presented knee retainer and the presented entertainment system serve in particular for the operation of the presented vehicle. Accordingly, it is provided, in a possible refinement of the presented vehicle, that the vehicle comprises an air conditioning system with a temperature sensor, wherein the temperature sensor is arranged on the vehicle in such a manner that air heated by the entertainment system can be conducted by the at least one dissipating device of the knee retainer past the temperature sensor in such a manner that an interior temperature of the vehicle can be correctly detected independently of the tempered air by the temperature sensor.

Further advantages and refinements emerge from the description and the attached drawings.

It goes without saying that the features mentioned above and those which have yet to be explained below can be used not only in the respectively stated combination, but also in other combinations or on their own without departing from the scope of the present invention.

FIG. 1 illustrates a basic body 1 which, together with dissipating devices 3, forms a possible refinement of the presented knee retainer 5. The dissipating devices 3 are each arranged here laterally on the basic body 1 and protect a region laterally below the basic body and a region laterally in front of the basic body 1 or the knee retainer 5 against possibly incoming tempered air. This means that incoming air is diverted by the dissipating devices 3, i.e. is conducted away laterally from the basic body 1.

Figure 2:
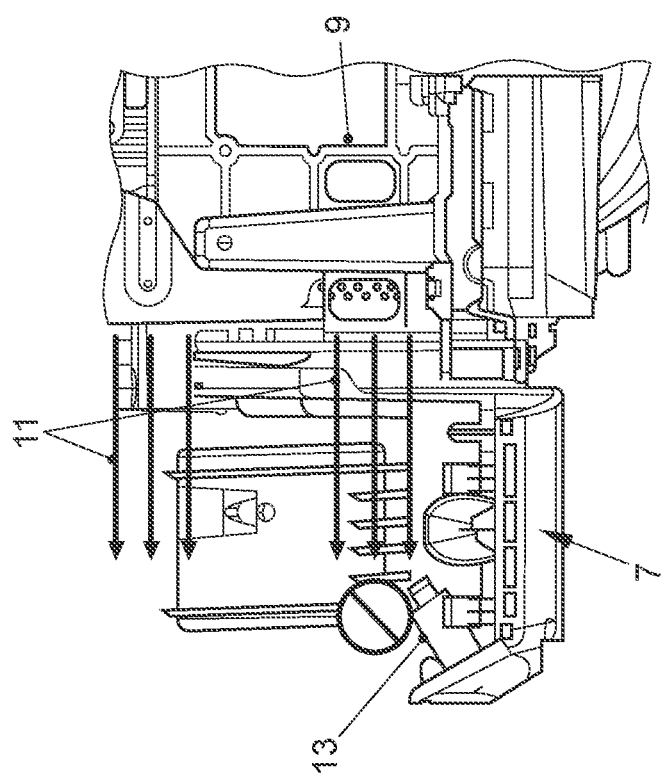
FIG. 2 shows an arrangement of an entertainment system in a vehicle according to the prior art.

FIG. 2 illustrates a region for accommodating electronic elements of a vehicle according to the prior art. An entertainment system 9 blows air heated by electronic elements of the entertainment system 9 into a region 7, as illustrated by arrows 11. The heated air blows against a temperature sensor 13 arranged in the region 7 and said temperature sensor accordingly measures a temperature which is increased in relation to an interior of the vehicle, which, in turn, leads to a defective air conditioning regulation for a passenger of the vehicle since said air conditioning regulation is set to be too cold, for example.

Figure 3:
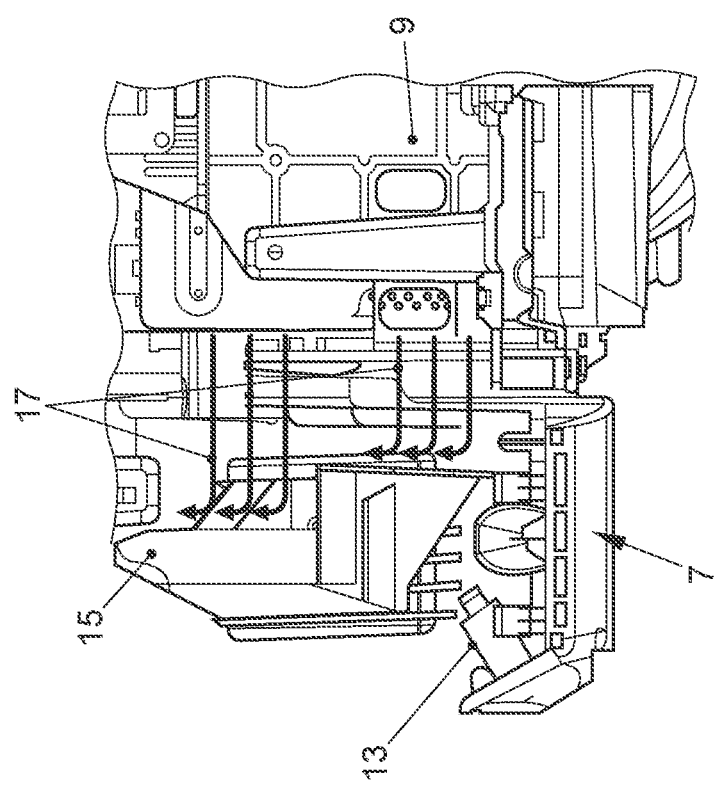
FIG. 3 shows an arrangement according to an embodiment of the present invention of an entertainment system with a knee retainer according to an embodiment of the present invention.

FIG. 3 illustrates the region 7 from FIG. 2 with a possible refinement of the presented knee retainer 15. The air heated by the entertainment system 9 is now blown on to the knee retainer 15 and diverted by dissipating devices, which are included by the knee retainer 15, in the form of heat-conducting plates, as illustrated by the arrows 17. Accordingly, heat is not admitted by the entertainment system 9 into the region 7, and therefore the temperature sensor 13 outputs a value corresponding to a temperature of the interior of the vehicle and the air conditioning regulation leads to a temperature which is pleasant for the passenger.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A knee bracket for a vehicle, the knee bracket comprising:
    at least one deflector device configured to deflect air, which has been tempered by an electronic element of the vehicle and is conducted on to the knee bracket, in such a manner that the tempered air is conducted past a region of the vehicle that is to be protected against temperature effects caused by the tempered air,
    wherein the vehicle further includes an entertainment system mounted in proximity to the knee bracket and configured to conduct the tempered air that has been tempered by the entertainment system to the at least one deflector device arranged on the knee bracket,
    wherein the vehicle further includes an air conditioning system with a temperature sensor, and
    wherein the temperature sensor is arranged on the vehicle in such a manner that the tempered air from the entertainment system is conducted by the at least one deflector device of the knee bracket past the temperature sensor in such a manner that an interior temperature of the vehicle is correctly detected independently of the tempered air by the temperature sensor.

2. The knee bracket as claimed in claim 1, wherein the at least one deflector device is a heat-conducting plate.

3. The knee bracket as claimed in claim 1, wherein the knee bracket is configured to be arranged on the vehicle in such a manner that the tempered air is conducted past the region in such a manner that an interior temperature of the vehicle is correctly detected independently of the tempered air by at least one temperature sensor arranged in the region.

4. The knee bracket as claimed in claim 1, wherein the knee bracket is formed from metal, plastic, or composite material, or any combination thereof.

5. The knee bracket as claimed in claim 1, wherein the at least one deflector device is arranged at least one of horizontally or vertically with respect to a basic body of the knee bracket and is arranged at least one of laterally or centrally on the basic body.

6. An entertainment system for a vehicle, comprising:
    a conducting element configured to conduct air tempered by the entertainment system to at least one deflector device arranged on a knee bracket,
    wherein the knee bracket is mounted within the vehicle in proximity to the conducting element,
    wherein the at least one deflector device is configured to deflect the tempered air in such a manner that the tempered air is conducted past a region of the vehicle to be protected against temperature effects caused by the tempered air,
    wherein the vehicle further includes an air conditioning system with a temperature sensor, and
    wherein the temperature sensor is arranged on the vehicle in such a manner that the tempered air from the entertainment system is conducted by the at least one deflector device of the knee bracket past the temperature sensor in such a manner that an interior temperature of the vehicle is correctly detected independently of the tempered air by the temperature sensor.

7. A vehicle, comprising:
    a region which is to be protected against temperature effects caused by tempered air;
    a knee bracket having at least one deflector device configured to deflect the tempered air in such a manner that the tempered air is conducted past the region;
    an entertainment system configured to conduct the tempered air that has been tempered by the entertainment system to the at least one deflector device arranged on the knee bracket; and
    an air conditioning system with a temperature sensor,
    wherein at least one of the knee bracket or the entertainment system are at least partially arranged in a region within a knee impact region of the vehicle, and
    wherein the temperature sensor is arranged on the vehicle in such a manner that the tempered air from the entertainment system is conducted by the at least one deflector device of the knee bracket past the temperature sensor in such a manner that an interior temperature of the vehicle is correctly detected independently of the tempered air by the temperature sensor.

8. The vehicle as claimed in claim 7, wherein the at least one deflector device is a heat-conducting plate.

9. The vehicle as claimed in claim 7, wherein the knee bracket is configured to be arranged on the vehicle in such a manner that the tempered air is conducted past the region in such a manner that an interior temperature of the vehicle is correctly detected independently of the tempered air by at least one temperature sensor arranged in the region.

10. The vehicle as claimed in claim 7, wherein the knee bracket is formed from metal, plastic, or composite material, or any combination thereof.

11. The vehicle as claimed in claim 7, wherein the at least one deflector device is arranged at least one of horizontally or vertically with respect to a basic body of the knee bracket and is arranged at least one of laterally or centrally on the basic body.

\* \* \* \* \*